(12) United States Patent
Dreeben et al.

(10) Patent No.: US 11,069,841 B2
(45) Date of Patent: Jul. 20, 2021

(54) MULTILAYER CERAMIC CONVERTER WITH STRATIFIED SCATTERING

(71) Applicant: OSRAM Opto Semiconductors GmbH, Regensburg (DE)

(72) Inventors: Thomas Dreeben, Swampscott, MA (US); Zhengbo Yu, Shrewsbury, MA (US); Alan Lenef, Belmont, MA (US)

(73) Assignee: OSRAM OPTO SEMICONDUCTORS GMBH, Regensburg (DE)

(*) Notice: Subject to any disclaimer, the term of this patent is extended or adjusted under 35 U.S.C. 154(b) by 0 days.

(21) Appl. No.: 16/406,950

(22) Filed: May 8, 2019

(65) Prior Publication Data
US 2020/0357959 A1 Nov. 12, 2020

(51) Int. Cl.
*H01L 33/50* (2010.01)

(52) U.S. Cl.
CPC .......... *H01L 33/505* (2013.01); *H01L 33/502* (2013.01); *H01L 2933/0041* (2013.01); *H01L 2933/0091* (2013.01)

(58) Field of Classification Search
CPC ..... H01L 33/50; H01L 33/501; H01L 33/502; H01L 33/505
USPC .......................................................... 257/98
See application file for complete search history.

(56) References Cited

U.S. PATENT DOCUMENTS

| | | | |
|---|---|---|---|
| 2011/0002140 A1* | 1/2011 | Tsukahara | B32B 27/286 362/602 |
| 2012/0001214 A1 | 1/2012 | Ooyabu et al. | |
| 2012/0068213 A1 | 3/2012 | Zhang et al. | |
| 2015/0228870 A1* | 8/2015 | Goeoetz | H01L 33/50 257/98 |
| 2015/0261076 A1 | 9/2015 | Dijken et al. | |
| 2015/0298424 A1 | 10/2015 | Menke et al. | |
| 2016/0069539 A1* | 3/2016 | Grotsch | H01L 33/60 362/343 |
| 2017/0137328 A1* | 5/2017 | Kelso | B32B 18/00 |
| 2019/0195466 A1* | 6/2019 | Shimizu | F21V 9/30 |

* cited by examiner

*Primary Examiner* — Fazli Erdem
(74) *Attorney, Agent, or Firm* — Slater Matsil, LLP

(57) ABSTRACT

A multilayer ceramic converter with stratified scattering is disclosed. In an embodiment a ceramic wavelength converter assembly having a layered structure includes a phosphor layer, an upper barrier layer, and a lower barrier layer, wherein the phosphor layer is at least partially disposed between the upper barrier layer and the lower barrier layer.

20 Claims, 7 Drawing Sheets

MULTILAYER CERAMIC CONVERTER WITH STRATIFIED SCATTERING

TECHNICAL FIELD

This invention relates to ceramic wavelength converter assemblies, light emitting devices comprising ceramic wavelength converter assemblies and methods for producing ceramic wavelength converter assemblies.

BACKGROUND

LED (light emitting diode) based on phosphors often combines a blue light emitting InGaN chip with a yellow oxide converter such as YAG:Ce(Gd) phosphor/ceramics for the compromise of cost, efficiency and CRI (color rendering index). Currently, for white light LEDs, ceramic converters often used are YAG:Ce(Gd) ceramics for high internal quantum efficiency (IQE) and high lumens. YAG:Ce(Gd) ceramic converters currently used are normally doped with Gd (from 1 to 20 at. %) for color steering. Its cubic crystal structure and high diffusion coefficient impart easier densification at reasonable temperatures and provide the advantage to achieve high transparency.

However, with the ever-increasing demands on applications at elevated temperatures with increased operating current of high-power LED, YAG:Ce phosphor doped with Gd demonstrated a thermal quenching problem of reduced brightness at elevated temperatures (i.e. >110° C.).

Different potential methods to improve the thermal quenching performance of ceramic converters apart from the efforts on the design of package have been proposed, such as (1) reducing the doping level of Gd as a dopant or even totally eliminating it; and/or (2) using higher thermal conductive materials as a matrix in the form of composites, such as YAG:Ce phosphor in $Al_2O_3$, AlN etc. Of these composite ceramic converter materials, YAG:Ce phosphor in $Al_2O_3$ matrix is of the most interest, simply because both are oxides and have a very good physical and thermal compatibility at reasonable processing/operation ranges. YAG:Ce(Gd) usually has a thermal conductivity of 5-9 $Wm^{-1}K^{-1}$ whereas $Al_2O_3$ has a higher thermal conductivity of about 22-39 $Wm^{-1}K^{-1}$ at room temperature depending on the sample conditions.

Completely eliminating Gd from YAG:Ce(Gd) phosphor will improve the thermal quenching significantly, however, it also requires to change the current ceramic converter dimension especially in thickness significantly in order to achieve the same color desired in single phase form; e.g., from 120 µm to about 30 µm or below, which is too thin for normal production procedure to handle. Therefore reducing the amount of Gd doping in YAG:Ce phosphor/ceramics seems a compromised method with a compromised performance.

Using a phosphor material, such as YAG:Ce in $Al_2O_3$ as matrix can improve the thermal conductivity. On the other hand, it results in low forward and in-line transmission because of its non-cubic crystal structure causing bi-infringe effect combined with the residual pores, and the difference of refractive indices between YAG and $Al_2O_3$ etc., all these cause excessive light scattering which in turn significantly reduce the in-line transmission, and hence affect the light output. To increase the sintering temperature, to prolong the sintering dwelling time, or to introduce a small amount of liquid phase can improve translucency of composite materials with an $Al_2O_3$ matrix, but it will cause decrease in IQE (internal quantum efficiency) because of the potential chemical incompatibility (reactions, defects etc.). Spark plasma sintering (SPS) and hot isostatic pressing (HIP) have also been applied to reinforce the densification of the composite materials. However, these methods result in darkening issues because of the furnace lining materials at high temperature and reducing atmosphere etc., hence reducing the IQE significantly to an unacceptable value for commercialization.

SUMMARY

It is an object of the invention to obviate the disadvantages of the prior art.

It is another object of the invention to provide a ceramic wavelength converter assembly that might be used in LED applications.

It is a further object of the invention to provide a light emitting device comprising at least one ceramic wavelength converter assembly of the present invention.

It is a further object of the invention to provide a method for producing a ceramic wavelength converter assembly of the present invention.

In accordance with one object of the invention, there is provided a ceramic wavelength converter assembly having a layered structure, the ceramic wavelength converter assembly comprising:
  a phosphor layer;
  an upper barrier layer; and
  a lower barrier layer;
  wherein the phosphor layer is at least partially disposed between the upper barrier layer and the lower barrier layer.

In accordance with another object of the present invention, there is provided a light emitting device comprising:
  a light-emitting structure configured to emit a primary light having a first peak wavelength; and
  a ceramic wavelength converter assembly positioned to receive the primary light from the light-emitting structure, the ceramic wavelength converter assembly comprising:
  a phosphor layer;
  an upper barrier layer; and
  a lower barrier layer;
  wherein the phosphor layer is at least partially disposed between the upper barrier layer and the lower barrier layer.

In accordance with another object of the present invention, there is provided a method for producing a ceramic wavelength converter assembly having a layered structure that includes a phosphor layer and an upper barrier layer and a lower barrier layer, the method comprising:
  providing a phosphor layer;
  applying an upper barrier layer on an upper side of the phosphor layer and applying a lower barrier on a lower side of the third layer;
  wherein the phosphor layer is at least partially disposed between the upper barrier layer and the lower barrier layer.

DETAILED DESCRIPTION OF ILLUSTRATIVE EMBODIMENTS

Figure 1:
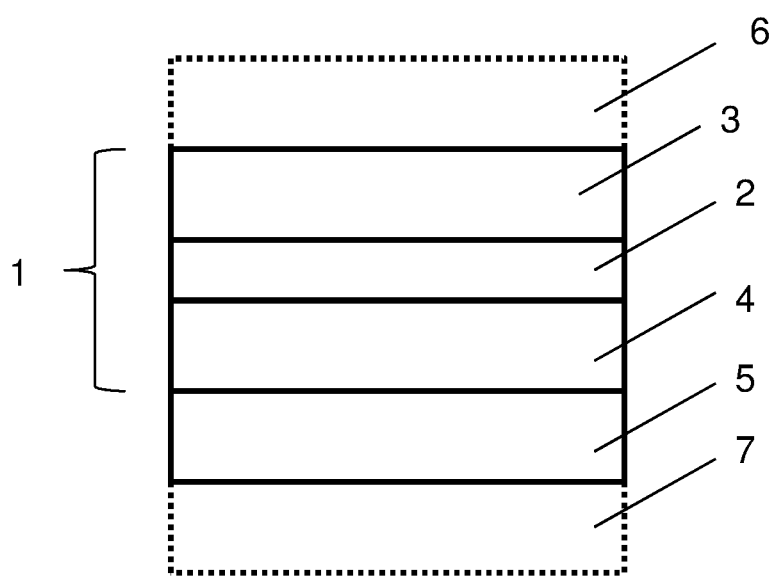
FIG. 1 is a schematic image comprising a ceramic wavelength converter assembly

For a better understanding of the present invention, together with other and further objects, advantages and capabilities thereof, reference is made to the following disclosure and appended claims taken in conjunction with the above-described drawings.

References to the color of the phosphor, LED, or conversion material refer generally to its emission color unless otherwise specified. Thus, a blue LED emits a blue light, a yellow phosphor emits a yellow light and so on.

The present invention is directed to a ceramic wavelength converter assembly having a layered structure comprising a phosphor layer, an upper barrier layer and a lower barrier layer, wherein the phosphor layer is at least partially disposed between the upper barrier layer and the lower barrier layer.

As used herein a wavelength converter is a solid structure that converts at least part of the light of a certain first wavelength to light of a certain second wavelength. An assembly is the composite of different materials. In general a ceramic wavelength converter assembly is a composite of different materials comprising at least one ceramic material to convert at least part of the light of a certain first wavelength to light of a certain second wavelength.

The ceramic wavelength converter assembly of the present invention has a layered structure, which can also be understood as a sandwich-structure.

The upper barrier layer or the lower barrier layer may comprise a porous structure.

In an embodiment, the upper barrier layer and the lower barrier layer comprise a porous structure.

A porous structure may be defined as a structure comprising pores having a radius in a range of about 20 nm to about 3000 nm. The structure may have a porosity in a range of between about 0.02% to about 2% by volume.

In general, the pore concentration, i.e., the number of pores per volume, correlates with porosity.

The porosity may be defined as follows:

$$\text{Porosity}=[4/3*\pi*(\text{pore radius})^3*(\text{pore concentration})]/(\text{sample volume}).$$

In the above formula, the porosity is given as a fraction and multiplying by 100 gives the porosity as a % value.

In an embodiment, the diameter of the pores of the porous structure of the upper barrier layer is bigger than the diameter of the pores of the porous structure of the lower barrier layer.

The diameter of the pores of the porous structure of the upper barrier layer may be smaller than the diameter of the pores of the porous structure of the lower barrier layer.

The upper barrier layer and the lower barrier layer may comprise or constitute of the same material. Alternatively, the upper barrier layer and the lower barrier layer may comprise or constitute of different materials.

The upper barrier layer and/or the lower barrier layer may comprise polycrystalline alumina (PCA), $SiO_2$, $MgAlO_4$, or combinations thereof. Alternatively, the upper barrier layer and/or the lower barrier layer may consist of polycrystalline alumina (PCA), $SiO_2$, $MgAlO_4$, or combinations thereof.

In a further embodiment, the upper barrier layer comprises $Al_2O_3$. In a further embodiment, the lower barrier layer comprises $Al_2O_3$. In an embodiment, the upper barrier layer and the lower barrier layer comprise $Al_2O_3$. In an alternative embodiment, the upper barrier layer or the lower barrier layer comprises $Al_2O_3$.

In a further embodiment, the upper barrier layer consists of $Al_2O_3$. In a further embodiment, the lower barrier layer consists of $Al_2O_3$. In an embodiment, the upper barrier layer and the lower barrier layer consist of $Al_2O_3$. In an alternative embodiment, the upper barrier layer or the lower barrier layer consist of $Al_2O_3$.

The upper barrier layer and the lower barrier layer may each have independently a thickness of between about 5 μm to about 100 μm, preferably of between about 8 μm to about 20 μm, more preferred of between about 10 μm to about 12 μm. In an aspect of the embodiment, the upper barrier layer and the lower barrier layer have the same thickness. In an alternative aspect of the embodiment, the upper barrier layer and the lower barrier layer have a different thickness.

According to the present invention, the phosphor layer is at least partially disposed between the upper barrier layer and the lower barrier layer. The phosphor layer may at least cover about 50% of the boundary between the upper barrier layer and the lower barrier layer. Preferably, the phosphor layer may at least cover about 75% of the boundary between the upper barrier layer and the lower barrier layer. More preferred, the phosphor layer may at least cover about 90% of the boundary between the upper barrier layer and the lower barrier layer. Even more preferred, the phosphor layer may at least cover more than about 99% of the boundary between the upper barrier layer and the lower barrier layer.

In an embodiment, the phosphor layer is completely disposed between the upper barrier layer and the lower barrier layer, which means there is no point of contact between the upper barrier layer and the lower barrier layer and about 100% of the boundary between the upper barrier layer and the lower barrier layer are covered with the phosphor layer.

According to the present invention, a phosphor is a material that converts light of a certain first wavelength to light of a certain second wavelength.

First wavelengths according to the present invention may be wavelengths between 300 nm to 570 nm. In an embodiment the first wavelengths are between 350 nm to 500 nm. In a further embodiment the first wavelengths are between 420 nm to 480 nm.

Structures that can produce light of a first wavelength are, e.g., InGaN or GaN chips, or solid state laser diodes.

Second wavelengths according to the present invention may be wavelengths between 350 nm to 800 nm. In an embodiment the second wavelengths are between 380 nm to 750 nm. In a further embodiment the second wavelengths are between 400 nm to 700 nm. In another embodiment, light of the second wavelength is yellow light (i.e., the second wavelengths are between 565 nm to 575 nm).

In an embodiment, the phosphor layer comprises a host material and at least one activator.

A host material may be an inorganic crystalline or polycrystalline material. Typical host materials are oxides, nitrides and oxynitrides, sulfides, selenides, halides or silicates of zinc, cadmium, manganese, aluminum, silicon, or various rare-earth metals.

In an embodiment the upper barrier layer and/or the lower barrier layer are made completely out of the host material. In this embodiment, the host material is in the form of a crystal, or in the form of a sintered ceramic material. The sintered ceramic material might further comprise a sinter aid.

In an embodiment the host material is a mixture of different host materials.

In a further embodiment, the host materials are particles, platelets, or elongated crystals embedded in a matrix material. The matrix material might be oxides. An exemplary embodiment of the matrix material is $Al_2O_3$.

In an embodiment, the host material comprises a material selected from the group consisting of garnet, $MgAl_2O_4$, silicates, oxynitrides and nitrides. In a preferred embodiment, the host material is garnet, e.g., YAG (yttrium-aluminum-garnet).

The phosphors may be doped with at least one activator. Doping in the context of phosphors means the introduction of impurities (activators) in the crystal structure of the host material. Activators may be metal ions, such as $Ce^{3+}$, $Gd^{3+}$, $Eu^{2+}$, wherein $Ce^{3+}$ is preferred depending on applications. The amount of activators in the crystal structure may vary in a broad range. Typical amounts of activators are 0.01 at % up to 20 at %. E.g., the amount of the activator in the phosphor layer may be at least 0.8 at %. The amounts of activators depend on optical properties of the final product such as color point, thermal quenching, and color temperature etc.

In an embodiment, the activator in the phosphor layer is Ce, Gd, or a combination thereof.

In a preferred embodiment, the host material in the phosphor layer is doped with the activator Ce.

In an embodiment, the phosphor is selected from the group consisting of YAG:Ce, YAG:Ce(Gd), LuAG:Ce, LuAG:Ce(Gd), and other oxynitride or nitride phosphors. Other oxynitride phosphors may be $SrSi_2O_2N_2$:Eu, α-SiAlON:Eu, and β-SiAlON:Eu. Other nitride phosphors may be $(Sr,Ba)_2Si_5N_8$:Eu and $La_3S_{16}N_{11}$:Ce.

In an embodiment, the phosphor of the phosphor layer is YAG:Ce. The YAG:Ce may be doped with at least 4% of the activator Gd. In alternative embodiments YAG:Ce may be doped with at least 6% of the activator Gd.

The phosphor layer may have a thickness of between about 5 μm to about 40 μm, preferably of between about 15 μm to about 25 μm, more preferred of between about 18 μm to about 20 μm.

The phosphor layer may comprise more than one layer. In an embodiment, the phosphor layer may comprise two, three, four or more layers, so-called sub-layers. With the use of different phosphor materials, the adjustment of the color of the emitted light is possible.

The ceramic wavelength converter comprising a phosphor layer, an upper barrier layer and a lower barrier layer may have a thickness of between about 15 μm to about 240 μm, preferably of between about 31 μm to about 65 μm, more preferred of between about 38 μm to about 44 μm.

The present invention is also directed to a light emitting device comprising a light-emitting structure configured to emit a primary light having a first peak wavelength, and a ceramic wavelength converter assembly positioned to receive the primary light from the light-emitting structure comprising a phosphor layer, an upper barrier layer, and a lower barrier layer, wherein the phosphor layer is at least partially disposed between the upper barrier layer and the lower barrier layer and wherein the lower barrier layer is arranged next to the light-emitting structure.

According to the present invention, the lower barrier layer is arranged next to the light-emitting structure in the light emitting device. "Arranged next to" in the present invention means that the lower barrier layer is the layer closest to the light-emitting structure compared to the further layers of the wavelength converter assembly. The lower barrier layer might be in direct contact to the light-emitting structure. In an alternative embodiment, there might be at least partially a bonding layer, such as a glue layer, between the lower barrier layer and the light-emitting structure.

Light-emitting structures that can produce and emit light of a first wavelength are, e.g., InGaN or GaN chips, or solid state laser diodes.

The ceramic wavelength converter assembly, the phosphor layer, the upper barrier layer and the lower barrier layer may correspond to the respective means and materials as described above.

The upper barrier layer or the lower barrier layer may comprise a porous structure.

In an embodiment, the upper barrier layer and the lower barrier layer comprise a porous structure.

In a further embodiment, the diameter of the pores of the porous structure of the upper barrier layer is bigger than the diameter of the pores of the porous structure of the lower barrier layer. Typical diameters of pores of the porous structures are about 40 μm to 6000 μm, preferably 200 μM to 1200 μm. The diameter of the pores of the porous structure of the upper barrier layer may be about 800 μm to about 6000 μm, preferably about 800 μm to about 1200 μm. The diameter of the pores of the porous structure of the lower barrier layer may be about 40 μm to about 800 μm, preferably about 300 μm to about 500 μm.

The diameter of the pores of the porous structure of the upper barrier layer may be about 800 μm to about 6000 μm, preferably about 800 μm to about 1200 μm and/or the diameter of the pores of the porous structure of the lower barrier layer may be about 800 μm to about 6000 μm, preferably about 800 μm to about 1200 μm.

The upper barrier layer and/or the lower barrier layer may comprise polycrystalline alumina. Alternatively, the upper barrier layer and/or the lower barrier layer may consist of polycrystalline alumina.

In a further embodiment, the upper barrier layer comprises $Al_2O_3$. In a further embodiment, the lower barrier layer comprises $Al_2O_3$. In an embodiment, the upper barrier layer and the lower barrier layer comprise $Al_2O_3$. In an alternative embodiment, the upper barrier layer or the lower barrier layer comprises $Al_2O_3$.

In a further embodiment, the upper barrier layer consists of $Al_2O_3$. In a further embodiment, the lower barrier layer consists of $Al_2O_3$. In an embodiment, the upper barrier layer and the lower barrier layer consist of $Al_2O_3$. In an alternative embodiment, the upper barrier layer or the lower barrier layer consist of $Al_2O_3$.

According to the present invention, the phosphor layer is at least partially disposed between the upper barrier layer and the lower barrier layer. The phosphor layer may at least cover about 50% of the boundary between the upper barrier layer and the lower barrier layer. Preferably, the phosphor layer may at least cover about 75% of the boundary between the upper barrier layer and the lower barrier layer. More preferred, the phosphor layer may at least cover about 90% of the boundary between the upper barrier layer and the lower barrier layer. Even more preferred, the phosphor layer may at least cover more than about 99% of the boundary between the upper barrier layer and the lower barrier layer.

In an embodiment, the phosphor layer is completely disposed between the upper barrier layer and the lower barrier layer, which means there is no point of contact between the upper barrier layer and the lower barrier layer and about 100% of the boundary between the upper barrier layer and the lower barrier layer are covered with the phosphor layer.

In an embodiment, the phosphor layer comprises a host material and at least one activator.

A host material may be an inorganic crystalline or polycrystalline material. Typical host materials are oxides, nitrides and oxynitrides, sulfides, selenides, halides or silicates of zinc, cadmium, manganese, aluminum, silicon, or various rare-earth metals.

In an embodiment the upper barrier layer and/or the lower barrier layer are made completely out of the host material. In this embodiment, the host material is in the form of a crystal, or in the form of a sintered ceramic material. The sintered ceramic material might further comprise a sinter aid.

In an embodiment the host material is a mixture of different host materials.

In a further embodiment, the host materials are particles, platelets, or elongated crystals embedded in a matrix material. The matrix material might be oxides. An exemplary embodiment of the matrix material is $Al_2O_3$.

In an embodiment, the host material comprises a material selected from the group consisting of garnet, $MgAl_2O_4$, silicates, oxynitrides and nitrides. In a preferred embodiment, the host material is garnet, e.g., YAG (yttrium-aluminum-garnet).

The phosphors may be doped with at least one activator. Doping in the context of phosphors means the introduction of impurities (activators) in the crystal structure of the host material. Activators may be metal ions, such as $Ce^{3+}$, $Gd^{3+}$, $Eu^{2+}$, wherein $Ce^{3+}$ is preferred depending on applications. The amount of activators in the crystal structure may vary in a broad range. Typical amounts of activators are 0.01 at % up to 20 at %. E.g., the amount of the activator in the phosphor layer may be at least 0.8 at %. The amounts of activators depend on optical properties of the final product such as color point, thermal quenching, and color temperature etc.

In an embodiment, the activator in the phosphor layer is Ce, Gd, or a combination thereof.

In a preferred embodiment, the host material in the phosphor layer is doped with the activator Ce.

In an embodiment, the phosphor is selected from the group consisting of YAG:Ce, YAG:Ce(Gd), LuAG:Ce, LuAG:Ce(Gd), and other oxynitride or nitride phosphors. Other oxynitride phosphors may be $SrSi_2O_2N_2$:Eu, α-SiAlON:Eu, and β-SiAlON:Eu. Other nitride phosphors may be $(Sr,Ba)_2Si_5N_8$:Eu and $La_3Si_6N_{11}$:Ce.

In an embodiment, the phosphor of the phosphor layer is YAG:Ce. The YAG:Ce may be doped with at least 4% of the activator Gd. In alternative embodiments YAG:Ce may be doped with at least 6% of the activator Gd.

The phosphor layer may comprise more than one layer. In an embodiment, the phosphor layer may comprise two, three, four or more layers, so-called sub-layers. With the use of different phosphor materials, the adjustment of the color of the emitted light is possible.

In an embodiment of the present invention, the phosphor layer is YAG:Ce and the upper and the lower barrier layers consist of polycrystalline alumina. In an aspect of this embodiment, the upper barrier layer comprises a porous structure having pore diameters of about 180 nm to about 220 nm and the lower barrier layer comprises a porous structure having pore diameters of about 480 nm to about 520 nm.

In some embodiments the light emitting devices are coated with at least one layer of $SiO_2$, $Al_2O_3$, or a combination thereof.

The ceramic wavelength converter assembly might be useful in any light emitting device known to the person skilled in the art. The light emitting devices comprising the ceramic wavelength converter assemblies, or light emitting devices of the present invention are useful in various applications. Exemplary applications of the light emitting devices are in automotive industry, in household appliances and in general lighting.

The present invention is further directed to a method for producing a ceramic wavelength converter assembly having a layered structure that includes a phosphor layer and an upper barrier layer and a lower barrier layer comprising providing a phosphor layer, applying an upper barrier layer on an upper side of the phosphor layer and applying a lower barrier on a lower side of the third layer, wherein the phosphor layer is at least partially disposed between the upper barrier layer and the lower barrier layer.

The ceramic wavelength converter assembly, the phosphor layer, the upper barrier layer and the lower barrier layer may correspond to the respective means and materials as described above.

The application of the layers may be carried out by a conventional tape cast process consisting of the procedures like tape-casting, blanking, lamination, punch etc. processes.

The ceramic wavelength converter assembly can also be made by various conventions processes, such as die pressing, cold isostatic pressing (CIP), tape cast, hot pressing (HP), hot isostatic pressing (HIP) etc. as forming and/or sintering processes.

A preferred method for producing a ceramic wavelength converter assembly having a layered structure is by conventional tape casting, i.e., by laminating the different layers of different compositions and thickness as designed followed by the punching, prefiring, and sintering. The desired shape for a sintered ceramic wavelength converter assembly may be typically about 1 mm×1 mm square with a thickness of 30 to 2000 microns. The size could be as small as 0.5 mm square for smaller light emitting devices.

In an embodiment, the upper barrier layer and the lower barrier layer comprise a porous structure.

In a further embodiment, the upper barrier layer and/or the lower barrier layer comprises $Al_2O_3$. The upper barrier layer and/or the lower barrier layer may comprise polycrystalline alumina.

A ceramic wavelength converter assembly might be prepared with a method according to the present invention.

FIG. 1 shows an exemplary ceramic wavelength converter assembly 1 of the present invention. For example, in a layered structure, scattering occurs separately from absorption in the two barrier layers, i.e., the upper barrier layer 3, which is neighbored to the air 6, and the lower barrier layer 4, which is neighbored to the glue layer 5. In addition, barrier-layer scattering occurs above the phosphor layer 2 separately from scattering that occurs below the phosphor layer 2. For a ceramic converter assembly with its layers shown in FIG. 1, the lower barrier layer 4 receives most of its blue light from the light-emitting structure 7 neighbored to the glue layer 5 below, and most of its converted light from the phosphor layer 2 above. In a preferred embodiment, the phosphor layer has a thickness 15 to 25 μm, bounded by two barrier layers, which are made from PCA (polycrystalline alumina) of a thickness of 8 to 15 μm.

As a result, scattering in the lower barrier layer 4 forward-scatters the maximum possible amount of blue light while back-scattering the maximum possible amount of converted light. The upper barrier layer 3 of FIG. 1 has a different task: Since it receives a full spectrum of light from the phosphor layer 2, maximum extraction of all light going upward towards the air is realized.

In general, light rays enter and exit the barrier layers multiple times. In this context, scattering configurations that maximize exits at the upper barrier layer are the desirable ones.

Figure 2:
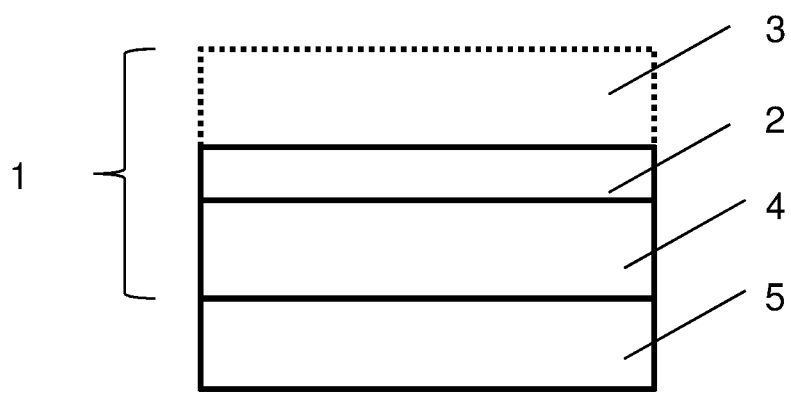
FIG. 2 is a schematic image comprising a phosphor layer and a lower barrier layer.

FIG. 2 shows a sub-domain of the ceramic wavelength converter 1 of the present invention. The upper barrier layer 3 is shown with a dotted line. In the lower barrier layer 4, 1 W of blue light is emitted in a Lambertian distribution upward from the glue layer 5. In addition, 0.3 W converted light is emitted in a Lambertian distribution downward from the phosphor layer 2. With a conversion efficiency of 60%, 0.6 W of converted light is emitted, of which half is directed downward to the lower barrier layer 4. Scattering parameters of size and pore concentration in the lower barrier layer 4 are explored to find scattering conditions that send the largest possible fraction of light (both blue and converted) up to the phopshor-layer boundary and away from the glue.

Figure 3:
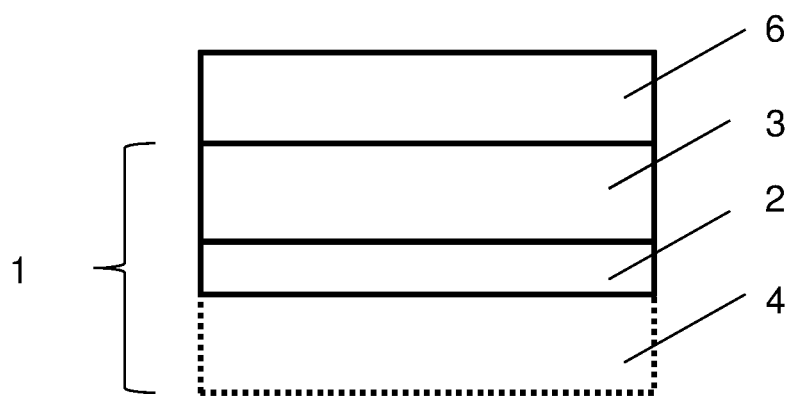
FIG. 3 is a schematic image comprising a phosphor layer and an upper barrier layer.

FIG. 3 shows a sub-domain of the ceramic wavelength converter 1 of the present invention. The lower barrier layer 4 is shown with a dotted line. In the upper barrier layer 3, 1 W of white light is emitted upward in a Lambertian distribution from the phosphor layer 2. Scattering parameters of size and pore concentration in the upper barrier layer 3 are explored to find the scattering conditions that send the largest possible fraction of light up to the layer boundary to the air 6 and away from the phosphor layer 2.

Figure 4:
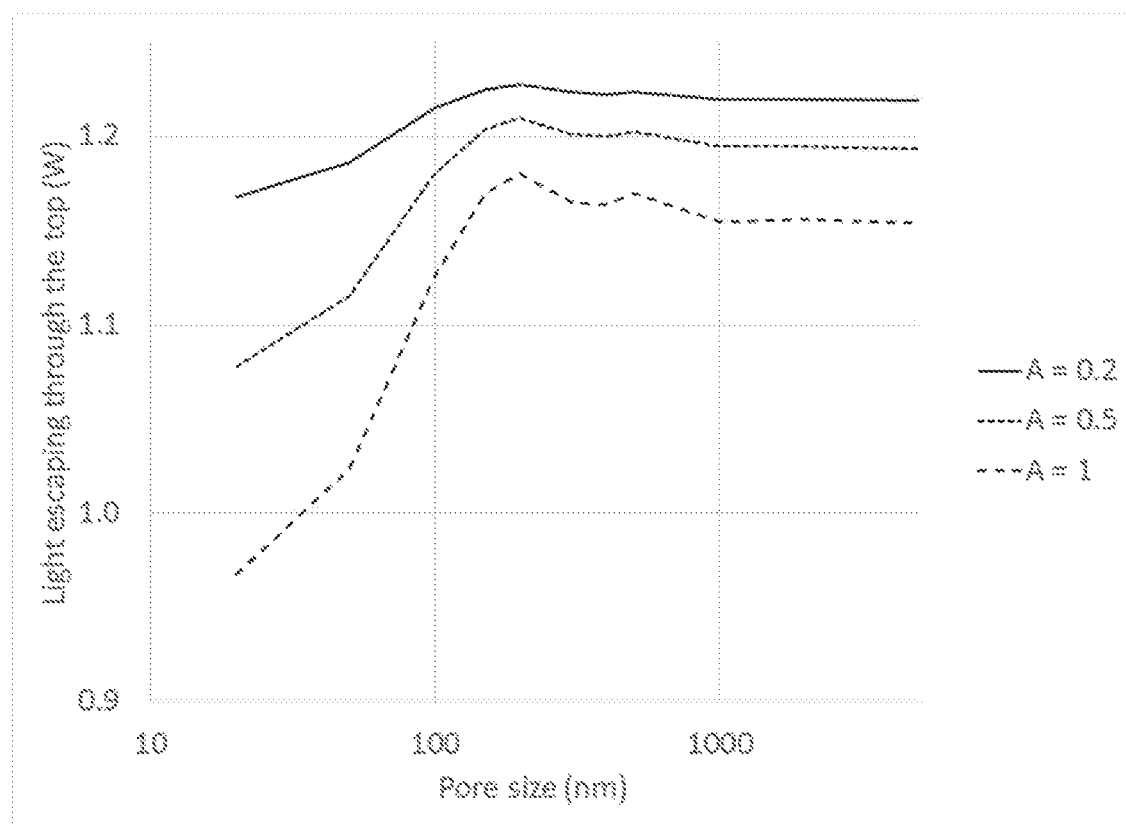
FIG. 4 shows the throughput of light in the lower barrier layer as a function of pore radius.
Figure 5:
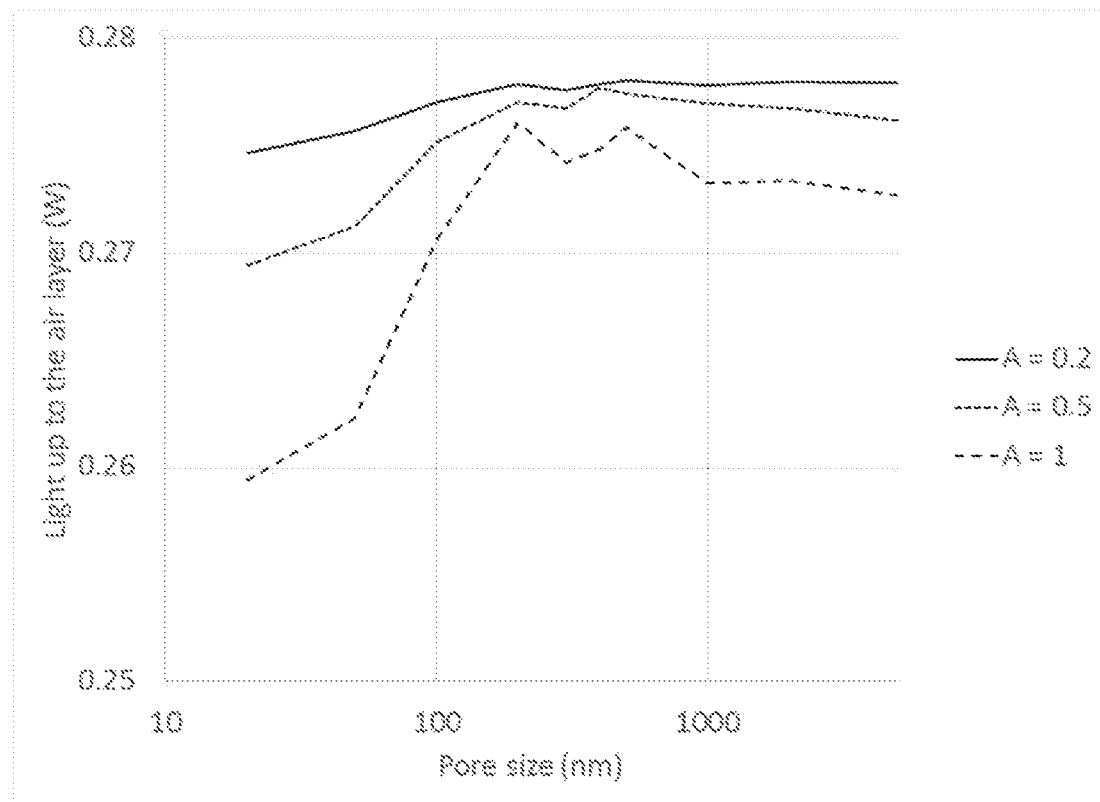
FIG. 5 shows the throughput of light in the upper barrier layer as a function of pore radius.

FIG. 4 and FIG. 5 show the throughput of light in each of the two barrier layers as a function of pore radius. The concentration of pores is characterized by a parameter A which is defined as the scattering coefficient multiplied by the layer thickness to make it dimensionless. The values at which A is held fixed (0.2, 0.5, and 1) describe a range of values that are common in ceramic wavelength converters.

FIG. 4 shows the throughput of light in the lower barrier layer that makes it up to the phosphor layer.

FIG. 5 shows the throughput of light in the upper barrier layer that makes it up to the air.

The parameter $A=\gamma*L$ is the same as the "scattering coefficient multiplied by the layer thickness" mentioned above. When light impinges on a block of material of thickness L [mm], some of it passes straight through to the other side, and some of it collides with a pore inside the material and gets scattered. The scattering coefficient $\gamma$ in units of (1/mm) is a material property that describes its likelihood to scatter—higher values of $\gamma$ cause more scattering.

$\gamma$ is defined so that the fraction of light that passes through the sample is $e^{-(\gamma*L)}$ and the fraction that gets scattered is $[1-e^{-(\gamma*L)}]$.

Preferably, increased light output in both barrier layers is observed when the y*L parameter is low, meaning when the pore concentrations in the barrier layers are low. Within the other design constraints associated with color, often less scattering is better than more scattering in both barrier layers. Pores of radius less than 100 nm may curtail throughput at all levels and should be avoided as much as possible. Optimal pore sizes in each layer are apparent, e.g., from the two plots shown in FIG. 4 and FIG. 5. Pore sizes might take on different values for the different barrier layers. According to FIG. 2, in the lower barrier layer, pores of radius 200 nm send the largest amount of light up to the phosphor layer. According to FIG. 3, in the upper barrier layer, pores of radius 500 nm offer better throughput to the air. In addition, these results appear to be robust enough that they can give acceptably high throughput independently of the pore concentrations.

In the upper layer, it may be counterintuitive that less than 0.3 W of light is escaping when 1 W has been put into the layer, when a single entry of light rays into the barrier layer is chosen: This occurs partly because TIR (total internal reflection) prevents light at higher angles from escaping into air from the PCA with refractive index of 1.77. In further ceramic wavelength converters, in barrier layers the light rays experience multiple trips through reflection from the chip mirror, i.e., the light-emitting structure, such as a InGaN chip. In the latter embodiment, the extraction is much higher than 30%.

Herein, scattering properties with different pore radii for the different layers are described. For barrier layers of PCA with a YAG-Ce phosphor layer, the radii of 200 and 500 nm apply to the lower and upper barrier layers, respectively. In addition, the lower values of pore density for the range considered are described, although at least a minimal amount of scattering might be necessary in the upper barrier layer for light extraction.

Figure 6:
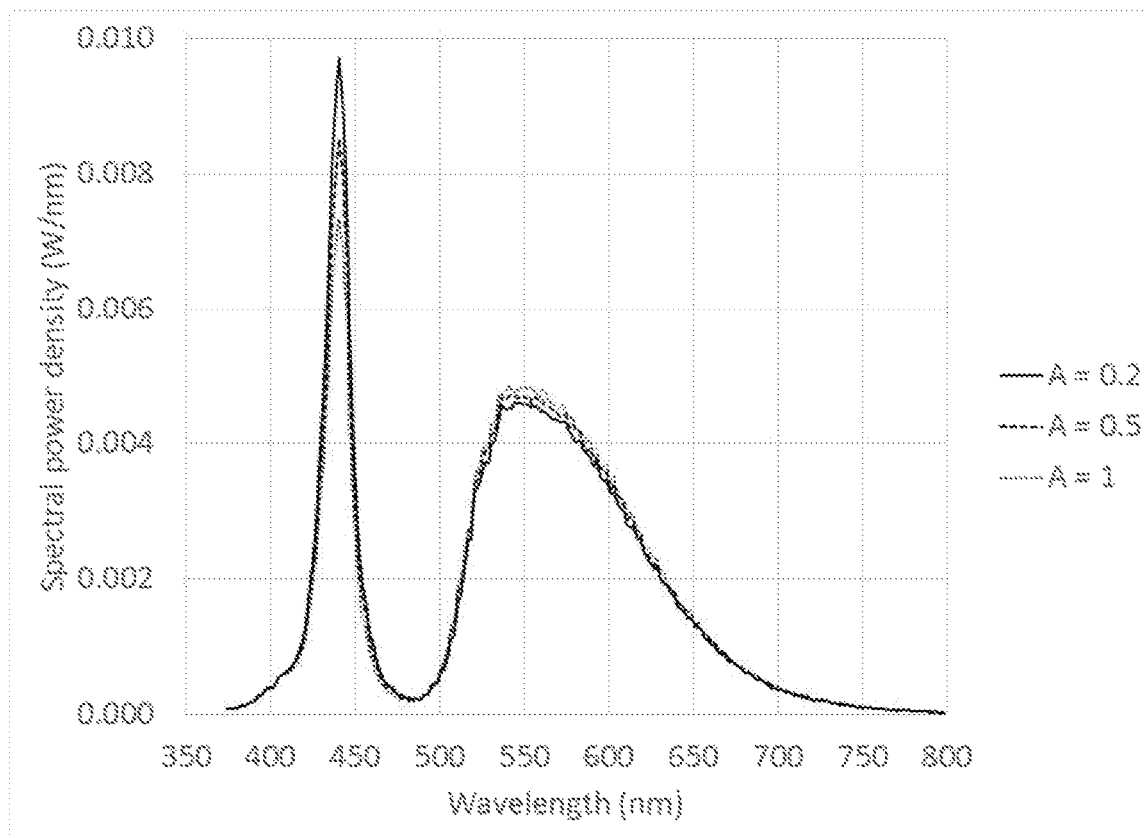
FIG. 6 shows the spectral power density of a phosphor layer sandwiched by both the upper and lower barrier layers, all on top of a layer of glue.

FIG. 6 shows the spectral power density of a phosphor layer (2) sandwiched by both the upper (3) and lower (4) barrier layers, all on top of a layer of glue (5). 1 W of blue light is emitted in a Lambertian distribution upward from the bottom of the glue layer. In addition, a mirror is added to the bottom of the glue layer representing the mirror inside of a chip. 95% of the light impinging on this mirror is reflected back up to the glue layer in a Lambertian distribution. This gives much of the light multiple paths through the barrier and phosphor layers, just as it has in a real package. Using results from FIGS. 4 and 5 for a preferred embodiment, the barrier layers have pores of radius 200 nm in the lower barrier layer, and radius 500 nm in the upper barrier layer. The spectrum of light coming out of this assembly is shown for the 3 different values of the scattering parameter A, with A=0.2, 0.5, 1. This embodiment shows how the color can be adjusted by adjusting the pore density.

Figure 7:
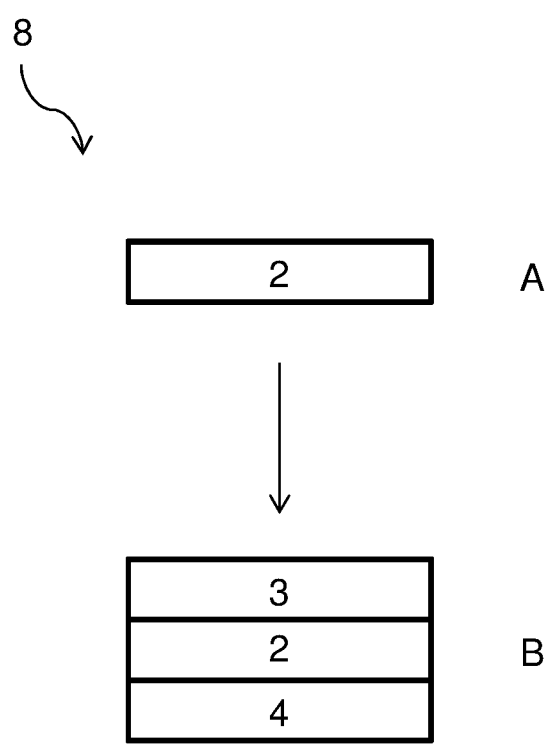
FIG. 7 shows a method for producing a ceramic wavelength converter assembly.

FIG. 7 shows an exemplary method 8 for producing a ceramic wavelength converter assembly 1. In a first step A, a phosphor layer 2 is provided. In a subsequent step B, an upper barrier layer 3 is applied on an upper side of the phosphor layer 2. Simultaneously, or subsequently, a lower barrier layer 4 is applied on a lower side of the phosphor layer 2.

While there have been shown and described what are at present considered to be preferred embodiments of the invention, it will be apparent to those skilled in the art that various changes and modifications can be made herein without departing from the scope of the invention as defined by the appended claims. The disclosure rather comprises any new feature as well as any combination of features, which in particular includes any combination of features in the appended claims, even if the feature or combination is not per se explicitly indicated in the claims or the examples.

What is claimed is:

1. A ceramic wavelength converter assembly having a layered structure, the ceramic wavelength converter assembly comprising:
    a phosphor layer;
    an upper barrier layer; and
    a lower barrier layer,
    wherein the phosphor layer is at least partially located between the upper barrier layer and the lower barrier layer, wherein the upper barrier layer and the lower barrier layer comprise a porous structure, and wherein a diameter of pores of the porous structure of the upper barrier layer is bigger than a diameter of pores of the porous structure of the lower barrier layer.

2. The ceramic wavelength converter assembly of claim 1, wherein the diameter of pores of the porous structure of the upper barrier layer is about 800 μm to about 6000 μm, and/or wherein the diameter of pores of the porous structure of the lower barrier layer is about 800 μm to about 6000 μm.

3. The ceramic wavelength converter assembly of claim 1, wherein the upper barrier layer and/or the lower barrier layer comprises $Al_2O_3$.

4. The ceramic wavelength converter assembly of claim 1, wherein the phosphor layer comprises a host material and activators.

5. The ceramic wavelength converter assembly of claim 4, wherein the host material comprises a material selected from the group consisting of garnet, $MgAl_2O_4$, silicates, oxynitrides and nitrides.

6. The ceramic wavelength converter assembly of claim 4, wherein the host material is garnet.

7. The ceramic wavelength converter assembly of claim 4, wherein the activators are Ce, or Gd, or a combination thereof.

8. The ceramic wavelength converter assembly of claim 4, wherein the activators of the host material are doped Ce.

9. The ceramic wavelength converter assembly of claim 1, wherein a phosphor of the phosphor layer is selected from the group consisting of YAG:Ce, YAG:Ce(Gd), LuAG:Ce and LuAG:Ce(Gd).

10. The ceramic wavelength converter assembly of claim 1, wherein a phosphor of the phosphor layer is YAG:Ce.

11. A light emitting device comprising:
a light-emitting structure configured to emit a primary light having a first peak wavelength; and
a ceramic wavelength converter assembly positioned to receive the primary light from the light-emitting structure, the ceramic wavelength converter assembly comprising:
a phosphor layer;
an upper barrier layer; and
a lower barrier layer,
wherein the phosphor layer is at least partially located between the upper barrier layer and the lower barrier layer,
wherein the lower barrier layer is arranged next to the light-emitting structure,
wherein the upper barrier layer and the lower barrier layer comprise a porous structure, and
wherein a diameter of pores of the porous structure of the upper barrier layer is bigger than a diameter of pores of the porous structure of the lower barrier layer.

12. The light emitting device of claim 11, wherein the upper barrier layer and/or the lower barrier layer comprises $Al_2O_3$.

13. The light emitting device of claim 11, wherein the phosphor layer comprises a host material and at least one activator.

14. The light emitting device of claim 11, wherein a phosphor of the phosphor layer is selected from the group consisting of YAG:Ce, YAG:Ce(Gd), LuAG:Ce, LuAG:Ce(Gd), other oxynitride phosphors and nitride phosphors.

15. A method for producing a ceramic wavelength converter assembly having a layered structure that includes a phosphor layer, an upper barrier layer and a lower barrier layer, the method comprising:
providing the phosphor layer;
applying the upper barrier layer on an upper side of the phosphor layer; and
applying the lower barrier layer on a lower side of the phosphor layer,
wherein the phosphor layer is at least partially disposed between the upper barrier layer and the lower barrier layer,
wherein the upper barrier layer and the lower barrier layer comprise a porous structure, and
wherein a diameter of pores of the porous structure of the upper barrier layer is bigger than a diameter of pores of the porous structure of the lower barrier layer.

16. The method of claim 15, wherein the upper barrier layer and/or the lower barrier layer comprises $Al_2O_3$.

17. The method of claim 15, wherein a phosphor of the phosphor layer is selected from the group consisting of YAG:Ce, YAG:Ce(Gd), LuAG:Ce, LuAG:Ce(Gd), other oxynitride phosphors and nitride phosphors.

18. The ceramic wavelength converter assembly of claim 1, wherein a phosphor of the phosphor layer is selected from the group consisting of oxynitride phosphors and nitride phosphors.

19. The light emitting device of claim 11,
wherein the diameter of pores of the porous structure of the upper barrier layer is about 800 μm to about 6000 μm, and/or
wherein the diameter of pores of the porous structure of the lower barrier layer is about 800 μm to about 6000 μm.

20. The method of claim 15,
wherein the diameter of pores of the porous structure of the upper barrier layer is about 800 μm to about 6000 μm, and/or
wherein the diameter of pores of the porous structure of the lower barrier layer is about 800 μm to about 6000 μm.

* * * * *